United States Patent [19]
Steinman

[11] Patent Number: 5,850,538
[45] Date of Patent: Dec. 15, 1998

[54] PRIORITY QUEUES FOR COMPUTER SIMULATIONS

[75] Inventor: Jeffrey S. Steinman, San Diego, Calif.

[73] Assignee: The United States of America as represented by the Administrator of the National Aeronautics and Space Administration, Washington, D.C.

[21] Appl. No.: 845,262

[22] Filed: Apr. 23, 1997

[51] Int. Cl.⁶ .................................................. G06F 15/16
[52] U.S. Cl. ........................ 395/500; 395/553; 364/578
[58] Field of Search ..................... 395/500, 673, 395/676, 680, 553; 364/578

[56] References Cited

U.S. PATENT DOCUMENTS

| | | | |
|---|---|---|---|
| 4,901,260 | 2/1990 | Lubachevsky | 364/578 |
| 5,247,650 | 9/1993 | Judd et al. | 395/500 |
| 5,701,439 | 12/1997 | James et al. | 395/500 |
| 5,794,005 | 8/1998 | Steinman | 395/500 |
| 5,801,938 | 9/1998 | Kalantery | 364/131 |

*Primary Examiner*—Paul V. Kulik
*Attorney, Agent, or Firm*—John H. Kusmiss

[57] ABSTRACT

The present invention is embodied in new priority queue data structures for event list management of computer simulations, and includes a new priority queue data structure and an improved event horizon applied to priority queue data structures. The new priority queue data structure is a Qheap and is made out of linked lists for robust, fast, reliable, and stable event list management and uses a temporary unsorted list to store all items until one of the items is needed. Then the list is sorted, next, the highest priority item is removed, and then the rest of the list is inserted in the Qheap. Also, an event horizon is applied to binary tree and splay tree priority queue data structures to form the improved event horizon for event management.

29 Claims, 11 Drawing Sheets

PRIORITY QUEUES FOR COMPUTER SIMULATIONS

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to priority queue data structures for use in simulation systems, such as for discrete event simulation of objects using a plurality of synchronous parallel computers in communication with each other so that the objects being simulated may interact.

BACKGROUND ART

Priority queues are used for sequential event list management in computer simulations, for example in parallel processing systems with discrete-event simulations. Priority queues aid in managing the event list. Discrete-event simulations are built upon two fundamental building blocks. First, there are simulation objects. Discrete-event simulations normally simulate many objects which frequently map to real world objects in the simulated system. Each simulated object contains an encapsulated set of variables that describe its state.

Second, there are events. All interactions between objects in a logically correct discrete-event simulation occur through time-tagged events which must be processed for each simulation object in their correct time order to preserve logical correctness. Logically correct parallel discrete-event simulations usually require an event to be associated with a single simulation object. However, sequential simulations do not always enforce this requirement. It should be noted that events can modify the state of their corresponding simulation object, and also may schedule new events to occur in the future (causality forbids events to ever be scheduled in the past).

As an example, during the course of a simulation, an event list containing a list of pending events waiting to be processed is maintained by simulation machinery. If the event list becomes empty at any time, then by definition, the simulation has reached an end time, and is therefore terminated. In sequential simulations, the pending event with the earliest time tag is always the next event to be processed. However, it should be noted that parallel simulations, especially optimistic simulations, can be more complicated.

Two basic operations are required for sequential event list management, a remove operation and an insert operation. The remove operation removes the event with the earliest time tag from the list of pending events so that it can be processed. The insert operation inserts a newly scheduled event back into the list of pending events. These two operations are essentially the same operations that are required by priority queue data structures.

Thus, it is apparent that efficient priority queue data structures are desirable for computer simulation systems, such as for discrete-event simulations. However, current priority queue data structures require large overhead of event list management. In addition, the performance of current priority queue data structures are limited.

Therefore, there is a need for priority queue data structures that have increased efficiency, enhanced performance, and reduced overhead.

Whatever the merits of the prior techniques and methods, they do not achieve the benefits of the present invention.

SUMMARY OF THE INVENTION

To overcome the limitations in the prior art described above, and to overcome other limitations that will become apparent upon reading and understanding this specification, the present invention is embodied in new priority queue data structures for event list management of computer simulations.

Some of the new priority queue data structures include use of an event horizon. One such event horizon is the Synchronous Parallel Environment for Emulation and Discrete Event Simulation ("SPEEDES") operating system as disclosed in the U.S. patent application referenced above. The event horizon is applied to linked lists, binary trees, and splay trees, to form new linked lists, binary trees, and splay trees.

The preferred priority queue data structure is comprised of a new Qheap data structure. The new Qheap is a completely new data structure for robust, faster, more reliable, and more stable event list management. Specifically, the Qheap of the present invention uses a temporary unsorted list to store all items until one of the items is needed. Then the list is sorted, next, the highest priority item is removed, and then the rest of the list is inserted in the Qheap (the heap is made out of linked lists).

In addition, the Qheap of the present invention can have an event horizon applied to it to form a SPEEDES Qheap. The SPEEDES Qheap priority queue data structure of the present invention is built out of linked lists to form the heap. This is different from normal heap data structures that use either fixed arrays or binary trees.

All of the priority queue data structures of the present invention have excellent real world value in that they provide fast event list management queues for utilization in computer systems, such as for computer simulations that use priority queues, such as networks, operating systems, simulations, artificial intelligence, etc.

A feature of the present invention is a new event list management system by a Qheap priority queue data structure. Another feature of the present invention is to apply an event horizon to priority queue data structures, such as to linked lists, binary trees, splay trees, and the Qheap.

An advantage of the present invention is that the new Qheap is robust, extremely fast, very reliable, and an exceptionally stable event list manager. Another advantage of the present invention is that performance of previous priority queue data structures, such as linked lists, binary trees, splay trees, are improved by exploiting the event horizon with the new priority queue data structures disclosed herein.

Further, the Qheap and the event horizon applied to the priority queues of the present invention have immense practical applications. For instance, the Qheap and the event horizon applied to the priority queues is applicable in aiding both parallel and sequential discrete-event simulations. As such, the Qheap and the event horizon applied to the priority queues have tremendous real-world value in computer simulation systems, such as in a computer simulation system using the SPEEDES operating system disclosed in the U.S. application referenced above.

For example, utilizing the Qheap in computer simulations provides predicable, more stable, and faster event list management. In addition, exploitation of the event horizon in parallel simulations allows one to process events optimistically in a risk-free manner (i.e., without requiring antimessages) using adaptable "breathing" time cycles with variable time widths. Further, use of the Qheap as well as exploitation of the event horizon significantly reduces the overhead of event list management that is common to virtually every discrete-event simulation.

The foregoing and still further features and advantages of the present invention as well as a more complete understanding thereof will be made apparent from a study of the following detailed description of the invention in connection with the accompanying drawings and appended claims.

BRIEF DESCRIPTION OF THE DRAWINGS

Referring now to the drawings in which like reference numbers represent corresponding parts throughout.

DETAILED DESCRIPTION OF THE INVENTION

The following description is organized as follows. First, an introduction is presented on one discrete event simulation operating system (SPEEDES) with a basic event horizon event list manager for informational purposes. Second, one embodiment of the present invention, the new event horizon, as applied to priority data structures, is presented. Third, the preferred embodiment of the present invention, the new Qheap priority data structure, is presented. Fourth, a new event horizon Qheap is presented (the event horizon applied to the new Qheap) to form a new SPEEDES Qheap. In all of the sections, working examples are provided to compare performance.

1. Introduction

Figure 1:
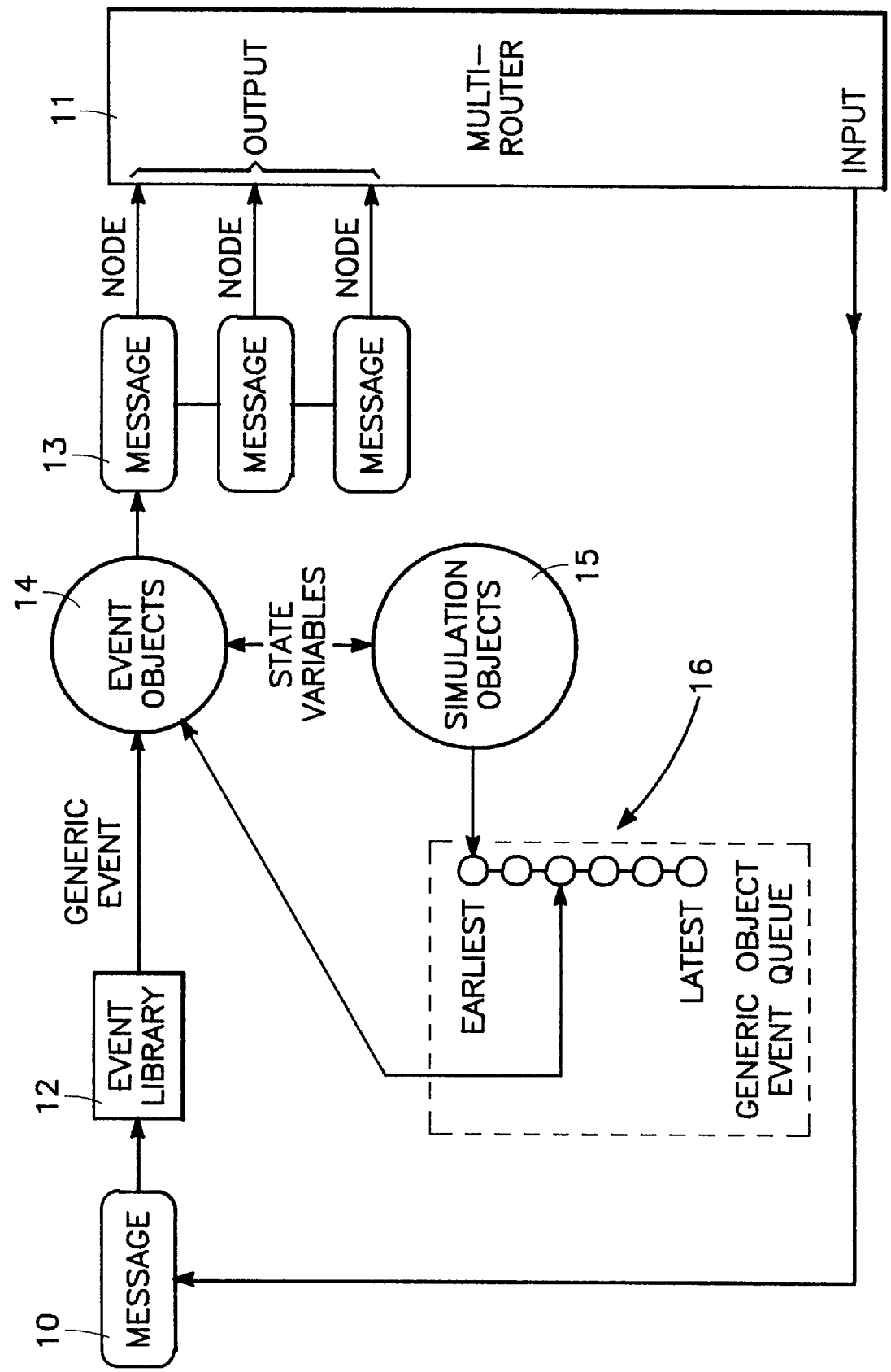
FIG. 1 is a block diagram illustrating the object-based architecture at a single node of the invention.

Object-based architecture of a simulation process operating on a SPEEDES based processor carried out at each node is illustrated for a single simulation object in FIG. 1. Discrete event simulation of objects begins with some basic steps for a single processor, such as a processor at a node of a Hypercube. First an event object is initiated by an input message 10 for a simulation object received via a multirouter 11 from the same processor or another processor. Time tagged messages received are queued in an event library 12. Multiple messages for a simulation object with the same time index will generate multiple event objects for the simulation object.

All event objects are user-defined as to their inherent capabilities from a base-class of generic simulation objects, where the term "objects" refers to object oriented programming techniques used to simulate physical objects assigned to processors for simulation of events, such as missiles, airplanes, tanks, etc., for simulation of war games, for example.

Event objects 14 are initialized by data contained within the messages received. After an event object is initialized, the message for it is discarded. Each event object is then attached to its own simulation object by a pointer to the simulation object 15.

Processing an event object in a processor is done in multiple steps that are written by the user into the simulation program. In the first step, an event object optimistically performs its calculations and generates messages 13 to schedule future events. However, the event object of the input message 10 is not immediately executed, i.e., the state of the simulation object, is not changed, and the messages for future event objects are not immediately released. Instead, the state changes and the generated messages are stored in the event object 14. Only the changes of the simulation object state variables are stored within the event object 14.

In the second step, the state variable changes that were computed in the first step are exchanged with the simulation object 15 so that the event object then has the old state values and the simulation object has the new values. For example, the state variables may consist of 1000 bytes. If the event requires only four bytes to be changed, only those four bytes are saved and exchanged. If rollback is later required, another exchange restores the previous state of the simulation object.

This feature, referred to as "delta exchange," reduces memory used in optimistic simulations at the expense of having to supply the exchange code in the simulation. Performing a delta exchange involves negligible time, so that rollback is carried out efficiently when needed without the need of special-purpose hardware.

The simulation program may include as part of delta exchange, the step of each time writing out to files these deltas. The simulation may then be rewound if rollback is necessary through several pairs of steps resulting in a reverse delta exchange for several events in sequence in a generic event queue 16, thus restoring the changes in reverse order from the files.

A delta exchange completes the first phase of carrying out an event, but as just noted, although the state of the simulation object is changed in the first phase, it can be rolled back. In the second phase, further processing is carried out, such as cleaning up memory, or sending messages 13 out to this and/or other processors and to graphics for record or display. This phase is carried out only after the event object is known to be valid so that there is no possibility of a rollback being required. Consequently, it is usually performed much later in time than the two steps in the first phase, but always without changing the state variables of the simulation object.

SPEEDES Internal Structure

While other multiple-synchronization systems (or test beds) have been developed, one reason for the success of SPEEDES is its unique object-oriented design. First, event processing is broken into some very basic steps (see FIG. 1).

Creating an Event

An event is created by a message. Note that multiple messages for an object with the same time stamp will generate multiple events, not a single event with multiple messages. Events are separate objects in C++ and should not be confused with simulation objects. User-defined events inherit capabilities from a base-class generic event object, which defines various virtual functions. It is through these virtual functions that events are processed.

An important optimization is in the use of free lists for memory management. SPEEDES manages old messages and events in a free list and reuses them whenever possible. This speeds up memory management and avoids the memory fragmentation problem.

Initializing an Event

Events are initialized by data contained within the message through a user-supplied virtual initialization function. After the event is initialized, the message is discarded into a free list. Each event is then attached to its own simulation object (i.e., the event object receives a pointer back to the simulation object).

Processing an Event: Phase 1

Processing an event is done in multiple steps that are all supported with C++ virtual functions written by the user. In the first step, an event optimistically performs its calculations and generates messages to schedule future events. However, the simulation object's state must not change. In addition, messages that would generate future events are not immediately released.

The event object itself stores changes to the simulation object's state and the generated messages. Only variables affected by the event are stored within the event object. Thus, if a simulation object contains 50,000 bytes and an event requires changing one of those bytes, only that one byte is stored within the event. There is no need to save copies of all 50,000 bytes of the object in case of rollback.

Delta Exchange

In the second step, the values computed in Phase 1 are exchanged with the simulation object. This exchange is performed immediately after the first step. After an exchange, the event has the old state values and the simulation object has the new values. Two successive exchanges (in the case of rollback) then restore the simulation object's state.

When an event is rolled back, there are two possibilities concerning messages that were generated by the Phase 1 processing. One is that the messages have already been released. In this case, antimessages must be sent to cancel those erroneous messages. The other is that the messages have not been released yet. In this case, the messages are simply discarded.

Processing an Event: Phase 2

In the third step, further processing is done for an event. This usually involves cleaning up memory or sending external messages out to graphics. This step is performed only after the event is known to be valid, in other words, when there is no possibility for the event to be rolled back. This step is usually performed much later in time than the previous two steps. The simulation programmer should not assume that the simulation object contains valid state information when processing in Phase 2. The processing done in this step must not change the state variables of its simulation object.

Managing the Event List: The Basic Event Horizon

One of the most time-consuming tasks in supporting discrete event simulations can be managing the event list. Managing a sorted list of future events can cripple the performance of low-granularity simulation. In parallel discrete event simulations, such management often leads to superlinear speedup. One technique for event list management is the basic event horizon.

The basic event horizon is a fundamental concept used in parallel simulations, without using linked lists, binary trees, or heaps. For example, a basic event horizon has been used to support risk-free optimistic simulations, as described in U.S. patent application Ser. No. 08/363,546 filed Dec. 12, 1994 by Steinman entitled "SYNCHRONOUS PARALLEL SYSTEM FOR EMULATION AND DISCRETE EVENT SIMULATION", which is herein incorporated by reference.

The basic event horizon continually maintains two lists. The primary list is sorted, while the secondary list is unsorted. As new events are scheduled, they are put into the secondary list. The earliest event scheduled to occur in the secondary list is preserved. When the time to process this event comes, the secondary list is sorted and then merged into the primary list. The time stamp of this critical event is the basic event horizon. Also, a global event horizon is determined by an earliest local event horizon from among all of the nodes and is defined as a value of one cycle for the system.

Figure 2:
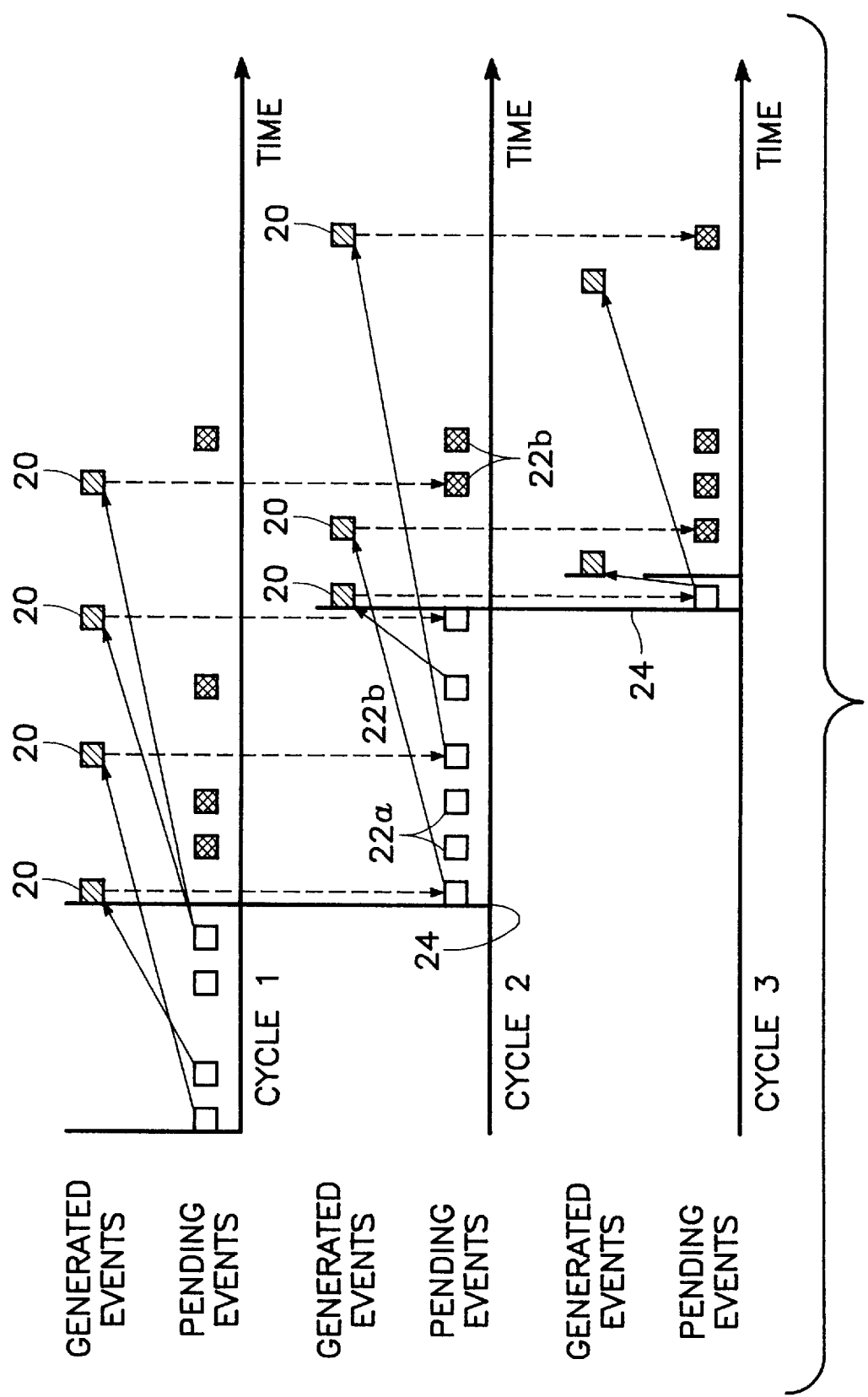
FIG. 2 is a timing diagram illustrating three successive cycles of operation with a basic event horizon.

The processing of event objects in successive cycles defined by the basic event horizon is illustrated in FIG. 2. Basically, in FIG. 2, events 20 generated during one cycle of the simulation become pending events 22a, 22b during the next cycle. Each cycle only processes those pending events 22a which do not occur beyond the event horizon 24 of that cycle. Those pending events 22b which occur beyond the event horizon are not processed during the current cycle. Also, corresponding messages of a global event horizon can be transmitted to effect changes to state variables of the simulation object only for those events whose time stamps are within the global event horizon.

A complete mathematical formulation of the basic event horizon was derived in the above-identified copending patent application under equilibrium conditions using a hold model. Various forms of a beta density function were consequently used to verify results of the analytic model.

However, although the basic event horizon is very effective, the present invention is embodied in a new Qheap priority queue data structure for event list management. Also, the present invention is embodied in the above event horizon applied to priority queue data structures, such as linked lists, binary tress, splay trees, and the Qheap to form a new event horizon, as disclosed below. The new Qheap priority queue data structure and new event horizon of the present invention both perform event list management.

Both the Qheap priority queue data structure and the new event horizon can be utilized in simulation systems, such as a system using the SPEEDES operating system disclosed in the U.S. application referenced above. However, it should be noted that the Qheap is a new priority queue in itself and can be used with numerous computer applications requiring a priority queue.

The present invention improves performance of previous priority queue data structures with the new Qheap and with the new event horizon applied to priority queue data structures disclosed herein. The following is a detailed description of the new Qheap data structure and the new event horizon along with performance results for each priority queue data structure.

2. The Improved Event Horizon

In order to exploit the improved event horizon for event list management algorithms in accordance with the present invention, it is assumed that as new events are generated, they are not immediately sent back into the main priority queue data structure, but instead are collected in an unsorted temporary holding queue. The event with the earliest time tag in this temporary queue is tracked. When the next event to be processed is in the temporary queue (i.e., the event horizon has been crossed), the queue is sorted (a binary merge sort algorithm is easily performed on linked lists) and then merged back into the main priority queue data structure.

Because all new events are put in the temporary holding queue, the insert operation is always accomplished in constant time with very low overhead since it simply involves adding another item to the bottom of an unsorted linked list. However, when the list must be sorted (this occurs after the event horizon is crossed), it is sometimes complicated to merge its sorted events with the main priority queue data structure. It should be noted that the main priority queue itself may be a very complicated data structure.

The following definitions are used in the description of the invention that follows:

N=Number of processing nodes
n=Number of pending events
m=Average number of events per event horizon
B=Event insertion bias (from top of list)

Further, for simplicity, unless otherwise stated, the present invention is described with the assumption that the simulation is under equilibrium conditions (i.e., one new event is generated per event processed, which is the basis of the hold model).

Priority Queues and the Improved Event Horizon

A number of well known priority queue data structures exist. The following is an overview of various priority queues, as well as performance analysis and measurements of working examples. Techniques in accordance with the present invention for applying the improved event horizon to each of these data structures follows.

Nine different beta-density functions were used in working examples to measure the performance of the different event-list data structures, including flat 30, triangle up 32, triangle down 34, bell shaped 36, asymmetric near future 38, asymmetric far future 40, far future 42, near future 44, and two hump 46. The beta function was chosen because of its flexibility in providing a wide variety of shapes. The beta density function is given below as $$\beta^{n_1 n_2}(t) = \frac{(n_1 + n_2 + 1)}{n_1! n_2!} t^{n_1}(1-t)^{n_2} \qquad (1)$$

A two hump distribution was generated by combining two equally weighted near and far future beta distributions. These distributions are shown below in Table 1. The Bias represents the average fraction of events required for traversal in a linked list starting from the top of the list.

TABLE 1

| Nine beta functions | | | |
|---|---|---|---|
| Description | $n_1$ | $n_2$ | Bias |
| Flat | 0 | 0 | 0.667 |
| Triangle Up | 1 | 0 | 0.800 |
| Triangle Down | 0 | 1 | 0.600 |
| Bell Shaped | 20 | 20 | 0.913 |
| Asymmetric Near Future | 2 | 18 | 0.710 |
| Asymmetric Far Future | 18 | 2 | 0.954 |
| Far Future | 20 | 0 | 0.977 |

TABLE 1-continued

| Nine beta functions | | | |
|---|---|---|---|
| Description | $n_1$ | $n_2$ | Bias |
| Near Future | 0 | 20 | 0.512 |
| Two Hump | 0.20 | 20.0 | 0.523 |

Figure 3:
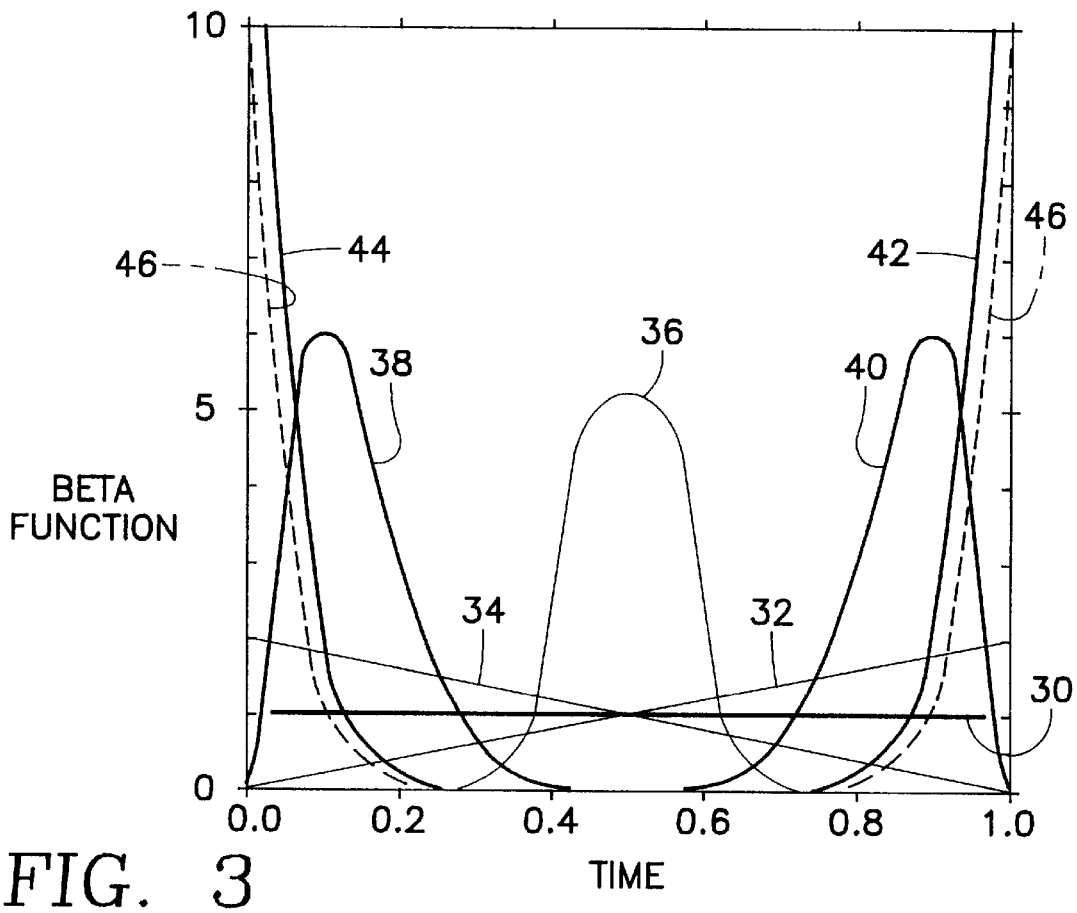
FIG. 3 is a plot illustrating the nine beta-density functions analyzed in the example. These nine different beta functions represent a wide spectrum of event generation statistics.
Figure 4:
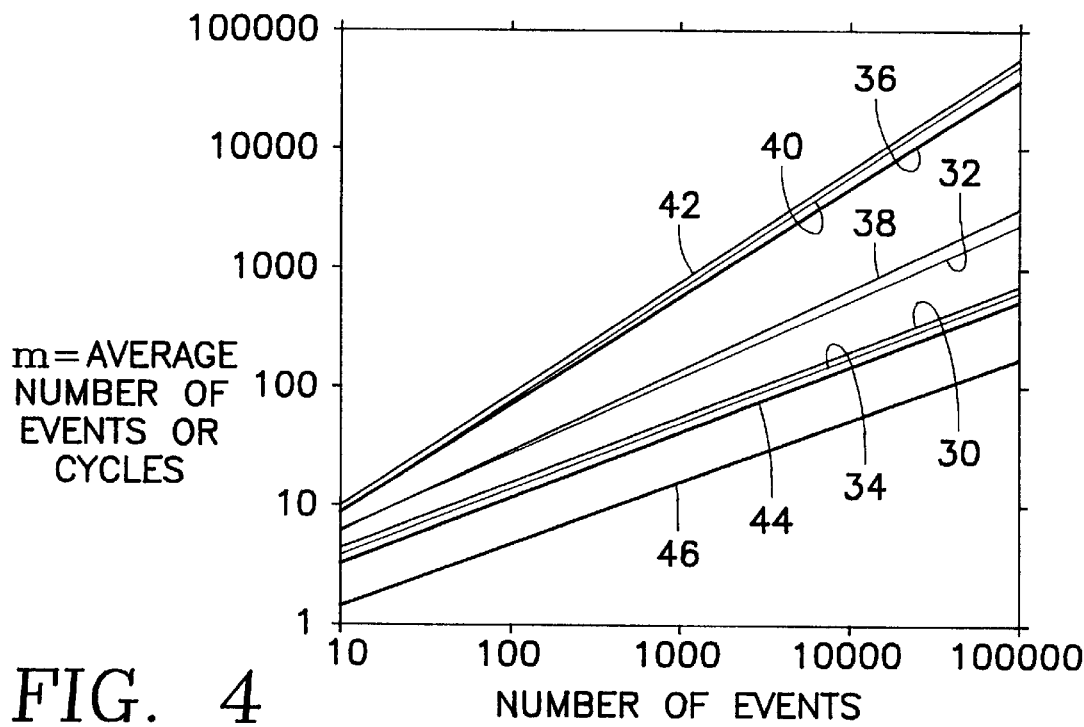
FIG. 4 is a plot illustrating the average number of new events collected in the temporary queue (assuming the hold model) per event horizon as a function of the number of pending events for each of these nine beta functions.

FIG. 3 is a plot illustrating the nine beta-density functions analyzed in the example. These nine different beta functions represent a wide spectrum of event generation statistics. FIG. 4 is a plot illustrating the average number of new events collected in the temporary queue (assuming the hold model) per event horizon as a function of the number of pending events for each of these nine beta functions.

All measurements in the working examples were obtained using for example, an HP9000/715 75 MHz workstation. The results were repeatable to within several microseconds. A C++ compiler was used with the optimizer enabled. For all measurements taken, each event generated a single new event distributed into the future according to the nine different beta distributions (i.e., the hold model).

All of the overheads (everything other than removing events from, and inserting new events into the list) were carefully measured and subtracted from the timing measurements by first running dummy loops that mimicked those operations. Further, steps were taken to keep the overhead small. Free lists were chosen to reuse event data structures in order to minimize memory-management overhead. Random numbers were pregenerated and stored in large arrays to reduce random-number-generation overheads.

The result of these efforts to minimize the overhead was that 0.0029 ms per event was subtracted from each of the measurements. This amount of overhead was small compared to the amount of time it typically took to manage the event lists for large (n>1,000) data structures. Enough events were processed for each data structure to become stable. Finally, the initial density of events as a function of time was correctly generated using the results derived by the previous event horizon described in the U.S. patent application Ser. No. 08/363,546 filed Dec. 12, 1994 by Steinman entitled "SYNCHRONOUS PARALLEL SYSTEM FOR EMULATION AND DISCRETE EVENT SIMULATION", referenced above.

Linked Lists

The simplest priority queue data structure is a sorted linked list. A linked list has events inserted and removed regularly. Inserting an event into a linked list data structure requires traversing the list until a proper slot is found for the event. Removing an event from the list is performed in constant time because the list is always sorted. The time for inserting and removing an event is given by:

$$T_{list} = C_1 Bn + C_2 \qquad (2)$$

Where $T_{list}$ is the time for inserting an event, $C_1$ represents the overhead for traversing a linked list, $C_2$ represents the overhead for removal, B is the event insertion bias, and n is the number of pending events. Performance results for typical linked list priority queues are given below in Table 2.

TABLE 2

Performance in milliseconds
for typical linked lists.

| Dist.\ n | 10 | $10^2$ | $10^3$ | $10^4$ | $10^5$ |
|---|---|---|---|---|---|
| Flat | 0.00130 | 0.01009 | 0.10626 | 4.79610 | 84.3564 |
| Tri. Up | 0.00187 | 0.01214 | 0.12988 | 6.01976 | 97.8821 |
| Tri. Down | 0.00166 | 0.01017 | 0.09735 | 4.28571 | 73.3466 |
| Bell Shaped | 0.00187 | 0.01426 | 0.14734 | 6.94305 | 113.168 |
| Asym. Near | 0.00185 | 0.01245 | 0.11435 | 5.11578 | 88.4158 |
| Asym. Far | 0.00127 | 0.01273 | 0.14534 | 7.17282 | 117.524 |
| Near Future | 0.00130 | 0.00908 | 0.15098 | 3.52737 | 63.8613 |
| Far Future | 0.00128 | 0.01047 | 0.13425 | 7.01388 | 118.910 |
| Two Hump | 0.00155 | 0.00597 | 0.12154 | 3.67722 | 62.8712 |

The event horizon is easily applied to linked list priority queues to form a new event horizon in accordance with the present invention for improving the overall results of the typical linked lists without an event horizon as shown in Table 2. For instance, the temporary list is sorted at each event horizon boundary and then merged back into the main list of pending events. The resulting data structure can be used in the SPEEDES operating system to form a SPEEDES Queue. The basic SPEEDES Queue, similar to the improved SPEEDES Queue of the present invention, was used in one version of the SPEEDES operating system described in the U.S. patent application Ser. No. 08/363,546 filed Dec. 12, 1994 by Steinman entitled "SYNCHRONOUS PARALLEL SYSTEM FOR EMULATION AND DISCRETE EVENT SIMULATION", referenced above.

Merging m (the average number of events per event horizon) sorted events into a list of n-m sorted events can be done in worst case O(n) time. Because sorting m events can be done in $O(Log_2(m))$ time, and because the sort and merge operations are only required every m events, the following expression relates the overhead for event list management per event.

$$T_{SPEEDSQueue} = C_1 + C_2\log_2(m) + C_3 \frac{n}{m} \qquad (3)$$

Where, m is the average number of events per event horizon, $C_1$ represents the constant overhead for inserting and removing an event under normal circumstances, $C_2$ represents the overhead for sorting m items using the binary merge sort algorithm on lists, and $C_3$ represents the overhead for merging m events in the temporary list back into the main list that contains n-m events.

The value for m that minimizes the overhead of the SPEEDES Queue can be derived by taking the derivative of the above expression with respect to m and setting it to zero. The result is given below.

From the above expression, the optimal value for m $$m_{opitional} = \frac{C_3}{C_2} n\log_e(2) \qquad (4)$$

is related to the overheads required by the merge and sort operations. Under normal conditions, the merge operation is expected to require less overhead than the sort operation. This means that the optimal value for m should be somewhat less than 0.693 times the number of total pending events (depending on the implementation). It also should be noted that the best performance to be expected from the SPEEDES Queue (obtained when plugging the optimal value for m back into equation 2) is logarithmic behavior with a very small coefficient.

While the SPEEDES Queue has exceptionally good performance when m is close to its optimal value, the SPEEDES Queue can also have very poor performance when m is close to the numerical value 1. In fact, when m is equal to 1, the SPEEDES Queue degenerates back into a linked list. Because of this, the SPEEDES Queue is not recommended for general discrete-event simulation systems, although it almost always is a better alternative to plain linked lists. There may be some exceptions, however, when the SPEEDES Queue is an excellent choice, especially when applications have enough lookahead to provide large event horizon cycles. Performance results of the SPEEDES Queue are given in Table 3.

TABLE 3

Performance in milliseconds
for the SPEEDES Queue.

| Dist.\ n | 10 | $10^2$ | $10^3$ | $10^4$ | $10^5$ |
|---|---|---|---|---|---|
| Flat | 0.00182 | 0.00278 | 0.00724 | 0.06199 | 0.24959 |
| Tri. Up | 0.00154 | 0.00296 | 0.00409 | 0.01940 | 0.04338 |
| Tri. Down | 0.00199 | 0.00306 | 0.00848 | 0.06959 | 0.28825 |
| Bell Shaped | 0.00208 | 0.00204 | 0.00343 | 0.01117 | 0.01915 |
| Asym. Near | 0.00181 | 0.00251 | 0.00429 | 0.01653 | 0.03860 |
| Asym. Far | 0.00152 | 0.00204 | 0.00305 | 0.01028 | 0.01771 |
| Near Future | 0.00194 | 0.00304 | 0.01362 | 0.08391 | 0.33714 |
| Far Future | 0.00162 | 0.00241 | 0.00285 | 0.00880 | 0.01648 |
| Two Hump | 0.00222 | 0.00449 | 0.02764 | 0.18375 | 0.75607 |

Binary Trees

Binary trees and their many variants are frequently used to support priority queue data structures. Each node in a binary tree has three pointers. The three pointers include a pointer its left child a pointer to its left child, and a pointer to its right child. The root node, of course, is unique because it has no parent since it is at the top of the tree. Leaf nodes (which are at the bottom of the tree) have no children.

Also, it is important to note that it is possible for a node that is not a leaf node to be missing either a left or right child. Each node in a binary tree also has a time tag value that is used for sorting. By definition, all of the elements in the left subtree below a node have time tags less than or equal to the node's time tag. Similarly, all of the elements in the right subtree below a node have values greater than or equal to the node's time tag.

When using binary trees to support priority queues, it is possible to maintain a special pointer to the leftmost element (i.e., the event with the smallest time tag). As an event is removed from the tree, the event with the next smallest time tag can be found in constant time by locally traversing the tree from the point where the most recent event was removed. This is faster than always starting at the top of the tree and traversing downward to the left until the leftmost leaf node is found.

Thus, most of the overhead involved when using binary tree data structures as priority queues occurs from inserting events, and not from removing events. Events are inserted by traversing down the tree, moving left or right, until a leaf node is reached. The event is then added as either a left or right child of the leaf node.

Inserting events can be very inefficient for "vanilla" binary trees. Because events are always removed from the left side of the tree and because new events are inserted somewhat randomly with typical event insertion biases larger than ½, trees almost always become skewed to the right (exponential time based event-generation distributions have an average bias of exactly ½, which means that binary trees will remain well balanced—also, it is possible for certain event generation statistics to result in average biases less than ½).

For example, it is possible for the tree to degenerate into a linked list if events are scheduled with a constant lookahead value (FIFO: first-in-first-out event scheduling). The present invention provides various techniques (discussed below) to limit this skewing problem. Before describing these various techniques, the basic tree rotation operation used by all of the tree data structures of the present invention is defined. Table 4 illustrates the inefficiency of inserting events for "vanilla" binary trees.

TABLE 4

Performance in milliseconds for binary trees.

| Dist.\ n | 10 | $10^2$ | $10^3$ | $10^4$ | $10^5$ |
|---|---|---|---|---|---|
| Flat | 0.00498 | 0.00784 | 0.01540 | 0.06468 | 0.29739 |
| Tri. Up | 0.00506 | 0.00940 | 0.02025 | 0.10505 | 0.50757 |
| Tri. Down | 0.00478 | 0.00691 | 0.01133 | 0.02605 | 0.05333 |
| Bell Shaped | 0.00588 | 0.00840 | 0.01291 | 0.03518 | 0.04759 |
| Asym. Near | 0.00506 | 0.00718 | 0.01009 | 0.02290 | 0.03906 |
| Asym. Far | 0.00552 | 0.01307 | 0.02537 | 0.06131 | 0.23754 |
| Near Future | 0.00506 | 0.00709 | 0.01153 | 0.02311 | 0.03983 |
| Far Future | 0.00589 | 0.0186 | 0.05720 | 0.36440 | 2.26619 |
| Two Hump | 0.00505 | 0.01178 | 0.04015 | 0.21838 | 1.17882 |

Figure 5:
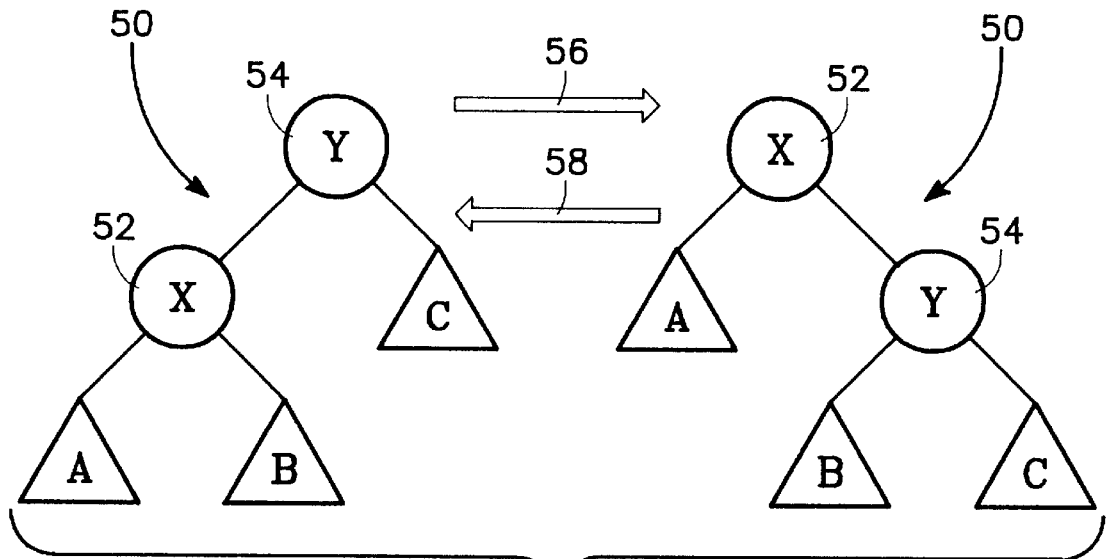
FIG. 5 illustrates tree rotation operation of a binary tree.

Tree rotations permit the structure of a binary tree (or subtree) to change while preserving the tree's integrity (i.e., the elements in the tree remain sorted). FIG. 5 illustrates tree rotation operation of a binary tree. The binary tree 50 has a node 52 and ascendants 54 (parent in this case), each with elements (denoted as A and B). As shown in FIG. 5, a right rotation 56 about the Y node preserves the B subtree so that the B subtree remains between X and Y. A left rotation 58 about the X node restores the tree back to its original shape.

Balanced Binary Trees

One very well known technique for managing binary sorted trees was developed by Adelson, Velsky, and Landis (see AVL Trees, Crane C., 1972. "Linear Lists and Priority Queues as Balanced Binary Trees." STAN-CS-72-259, Computer Science Department, Stanford University). Although the AVL Tree method ensures that a tree is always perfectly balanced, the overhead required is too high. In contrast, because large amounts of overhead are very undesirable and because a perfectly balanced tree is unnecessary, the present invention is embodied in method for producing a Balancing Heuristic Tree that contains less overhead, and can be used for example with the SPEEDES operating system.

The SPEEDES Balancing Heuristic and the SPEEDES Tree

The present invention includes a SPEEDES Balancing Heuristic to keep trees in rough balance with little overhead. To support this data structure, the number of descendants to the left and the number of descendants to the right are required by each node of the tree. Note that for a given node:

$$N_{left} + N_{right} + 1 = N_{subtree} \quad (5)$$

The balancing information is kept intact by the following. As events are removed or inserted, the tree is traversed downward starting from the root. The $N_{left}$ and $N_{right}$ values are modified at each node visited along the traversed path until the event is either removed or inserted. When inserting a new event, a balancing heuristic is applied at each node along the traversed path that tests if the subtrees below are grossly out of balance. This check first determines if the following expression is true (it should be noted that the factor of 3 was chosen empirically).

$$|N_{left} - N_{right}| > 3(N_{left} + N_{right}) \quad (6)$$

If this condition is true, then a second check is made to determine if there are enough events in the subtrees below to make it beneficial to rotate its structure. It has been determined that a reasonable number to use is 20 (however, if there are less than 20 events in the combined subtrees of a given node, then it is not worth the effort to perform tree rotation operations). If there are enough events to warrant a rotation, the tree is rotated either left or right in order to improve its balance before moving downward.

Because the rotations are done only when needed, it is possible for portions of the tree to become out of balance. This is not a serious problem, even though it may require additional work to bring the tree into balance, since it is amortized over time. Although the worst case performance of this heuristic is not guaranteed, working measurements indicate that the balancing heuristic of the present invention keeps the tree in nearly perfect balance with relatively low overheads. Sample performance of a working example for balancing the Heuristic tree of the present invention is provided in Table 5.

TABLE 5

Performance in milliseconds for balancing heuristic tree of the present invention.

| Dist.\ n | 10 | $10^2$ | $10^3$ | $10^4$ | $10^5$ |
|---|---|---|---|---|---|
| Flat | 0.00364 | 0.00952 | 0.01843 | 0.03216 | 0.04941 |
| Tri. Up | 0.00384 | 0.01007 | 0.01829 | 0.03175 | 0.04865 |
| Tri. Down | 0.00339 | 0.00951 | 0.01722 | 0.03236 | 0.04969 |
| Bell Shaped | 0.00385 | 0.01008 | 0.01674 | 0.02986 | 0.04648 |
| Asym. Near | 0.00357 | 0.00924 | 0.01701 | 0.03162 | 0.04948 |
| Asym. Far | 0.00495 | 0.01074 | 0.01750 | 0.02838 | 0.04470 |
| Near Future | 0.00366 | 0.00896 | 0.01820 | 0.03271 | 0.04922 |
| Far Future | 0.00478 | 0.01232 | 0.01866 | 0.02887 | 0.04240 |
| Two Hump | 0.00353 | 0.01002 | 0.01792 | 0.02935 | 0.04541 |

The balancing heuristic tree method described above can be extended to take advantage of the event horizon. To achieve this, first, events are not added to the tree one at a time, but instead are collected in a temporary holding queue. When the next event to be processed is in the temporary queue, it is sorted, the top event is removed (because it is the next event to be processed) and then the rest of the list is merged into the binary tree. In order to accomplish this merge operation, a time tag is required by each node of the tree. specifically, each node tracks the maximum possible time tag, $T_{max}$, allowed in its subtree. This information permits the tree to be locally traversed as the sorted list is merged instead of forcing each event in the list to start at the top of the tree the way normal insertion is usually performed.

Figure 6:
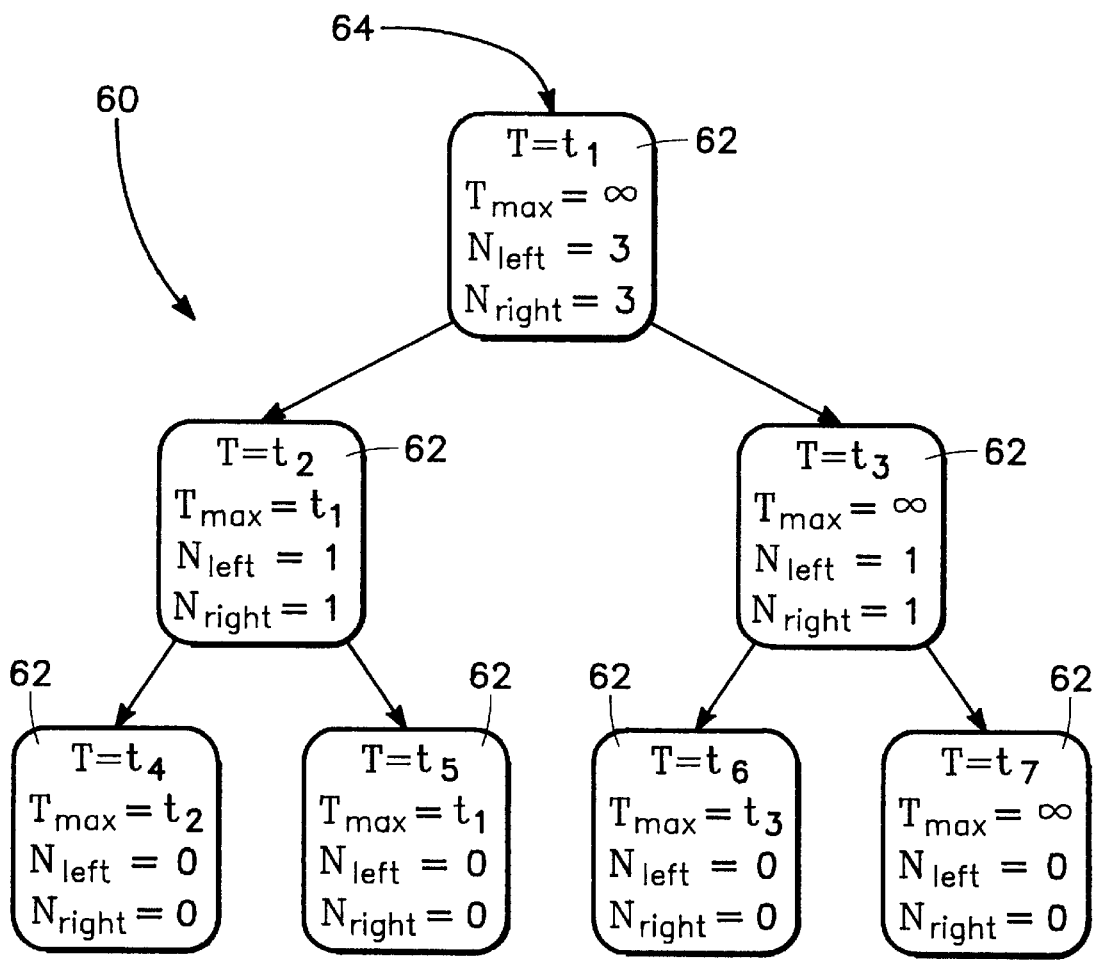
FIG. 6 illustrates an example of the SPEEDES Binary Tree data structure.

When a node is inserted into the tree as a left descendent, its value for $T_{max}$ is the time tag of its parent. If the event is a right descendent, its value for $T_{max}$ is the same as its parent's value for $T_{max}$. FIG. 6 illustrates an example of the SPEEDES Binary Tree data structure 60. In addition to normal pointers in a binary tree, and time tag values required for sorting, nodes 62 also maintain $T_{max}$, $N_{left}$, and $N_{right}$ values. The SPEEDES Tree also maintains a single pointer to the root of the tree and to the current event 64 (i.e., the node with the smallest time tag).

In the SPEEDES Tree, a pointer always designates the event with the earliest time tag in the tree. As events are popped out of the tree to be processed, the pointer is updated locally. In other words, popping events out of the tree doesn't require starting at the top of the tree and then working downward until the left-most node is found (this would take logarithmic time). Instead, the next event is obtained from the tree in constant time.

While popping events out of the tree, the balancing information ($N_{left}$ and $N_{right}$) is ignored. Thus, by the time the event horizon is about to be crossed, the tree balancing information is not correct. However, it can be corrected by working from the left-most event in the tree back up the tree until the root is reached, updating $N_{left}$ on each node visited in the process. The number of steps is less than $\log_2(n)$ because the tree will tend to be skewed to the right. Further, updating the tree-balancing information only occurs after m events are processed. Therefore, restoring the balancing information in the tree normally involves a negligible amount of overhead.

Merging the sorted list of new events into the tree is a complex process. The first event to be processed at the start of the next cycle will be the first event in the sorted secondary list, not the next event in the tree (this is part of the definition of the event horizon). Therefore, the pointer to the next event will be the first event in the secondary list. This first event is inserted as the left child of what was previously thought of in the tree as being the next event.

Now, the rest of the list must be merged into the tree. The tree is traversed left to right as events from the sorted secondary list are inserted into the SPEEDES Tree. After an event is inserted, the tree must be traversed upward until a node is reached that has $T_{max}$ greater than the time tag of the next event to be inserted. Only then is it safe to insert the next event into the current subtree. As the tree is ascended, the tree-balancing information is updated. Then, the subtree is traversed downward left and right, until the bottom of the tree (where the event is to be inserted) is reached. As the subtree is descended, the balancing heuristic operation is performed, to keep the tree from becoming unbalanced.

One way to further optimize event insertion is to track the most recent node that passes the $T_{max}$ test. Inserting the next event can start from that node instead of from the bottom of the tree where the previous event was inserted. This reduces the overhead for going up the tree as events from the secondary list are merged with the tree.

Once all of the events in the secondary list are merged into the tree, a final step is required. Starting from the last merged event, the tree must be ascended to the root, updating the tree balancing information along the way. After this step has been completed, the balancing information at each node of the tree is correct.

Measurements have shown that the worst case time for insertion is logarithmic for all of the event generation distributions studied to date. However, if many events are collected in the secondary list, then the number of traversal steps for insertion is comparable to $\log_2(n/m)$. Thus, the SPEEDES Tree performs better than logarithmic time for tree insertion (of course, at the expense of sorting the secondary list of m events). The average SPEEDES Tree overhead per event can be written as, $$T_{SPEEDESTree} = C_1 + C_2 \log_2(m) + C_3 \log_2(n/m) \qquad (7)$$

Here, $C_1$, $C_2$, and $C_3$ are the respective overhead coefficients for removing, sorting, and merging events. Note that if $C_2 = C_3$, there is no advantage to using the SPEEDES Tree over the plain Balancing Heuristic Tree described above. However, measurements have shown that there is an advantage to use the SPEEDES Tree if $C_2 \ll C_3$. In a specific working example, sorting 10,000 events on an IRIS4D SGI workstation using a binary merge sort algorithm was measured to take about 0.004 ms per event, while inserting events generated by a flat distribution into a Balancing Heuristic Tree of size 10,000 took about 0.032 ms per event.

The SPEEDES Tree data structure is ideal for managing events and is a significant improvement over the SPEEDES Queue of the U.S. application referenced above since it exhibits worst case logarithmic behavior. Performance of the SPEEDES Tree data structure is provided in Table 6.

TABLE 6

| | Performance in milliseconds for the SPEEDES tree. | | | | |
|---|---|---|---|---|---|
| Dist.\ n | 10 | $10^2$ | $10^3$ | $10^4$ | $10^5$ |
| Flat | 0.00440 | 0.00653 | 0.01353 | 0.02625 | 0.04217 |
| Tri. Up | 0.00421 | 0.00578 | 0.01046 | 0.02514 | 0.04264 |
| Tri. Down | 0.00459 | 0.00690 | 0.01285 | 0.02699 | 0.04396 |
| Bell Shaped | 0.00412 | 0.00588 | 0.00951 | 0.01838 | 0.03468 |
| Asym. Near | 0.00440 | 0.00672 | 0.01350 | 0.02792 | 0.04327 |
| Asym. Far | 0.00339 | 0.00457 | 0.00676 | 0.01691 | 0.02607 |
| Near Future | 0.00395 | 0.00746 | 0.01555 | 0.0288 | 0.04510 |
| Far Future | 0.00339 | 0.00493 | 0.00610 | 0.01401 | 0.02247 |
| Two Hump | 0.00450 | 0.00718 | 0.01554 | 0.01896 | 0.03315 |

Splay Trees

Another binary tree data structure includes the Splay Tree. The splay tree is regarded as one of the fastest tree-based priority queue data structures. Splay Trees use a two-step rotation operation, called the "splay operation", to bring elements inserted or removed back to the top of the tree. This heuristic process keeps the parts of the tree that have been recently accessed near the top of the tree in order to reduce future access times. The heuristic process works very well when inserting a large number of events into the tree with the same (or similar) time tags. However, when events are somewhat randomly inserted into the tree, the results are not as favorable. This is because of the large number of expensive rotations that are involved (often worse than $\log_2(n)$).

The splay operation on a node promotes that node to the top of the tree through a sequence of two-step rotations. There are four cases to consider when applying the splay operation to a node in the tree. In the first case, if the node is the root, then nothing needs to be done. In the second case, if the parent of the node is the root, then a rotation about the root is performed to make the node the new root.

Figure 7:
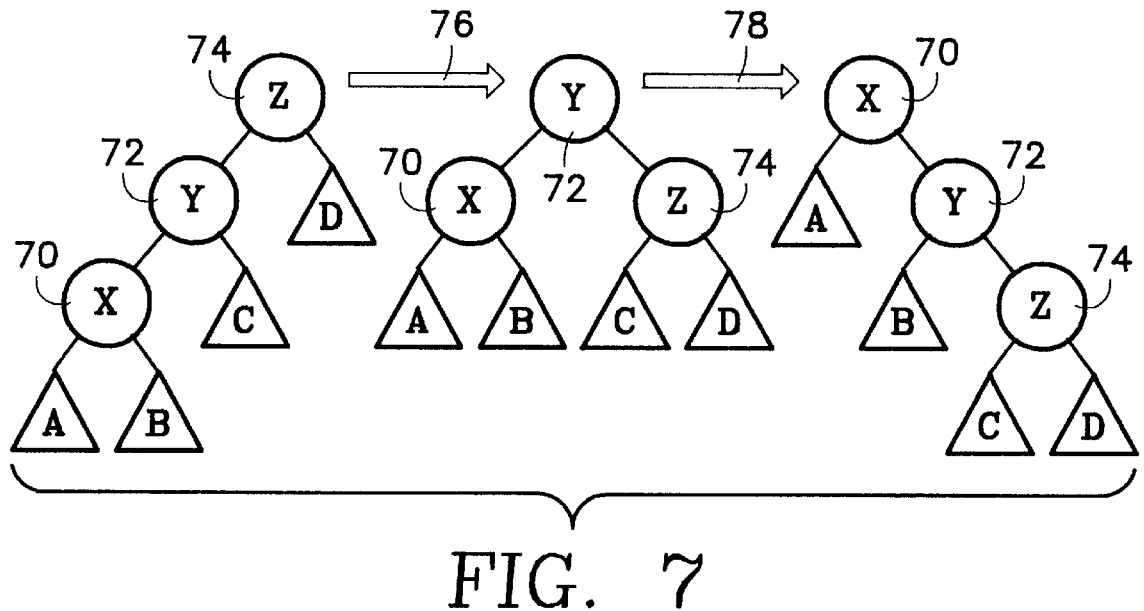
FIG. 7 illustrates Zig-Zig tree rotation of a splay tree.

In the third case, sometimes called a Zig-Zig (or Zag-Zag) case, a node 70 and a parent 72 are either both left descendants or are both right descendants of a grandparent 74. For this case, the grandparent 74 is rotated 76 first, then the parent 72 is rotated 78, as shown in FIG. 7.

Figure 8:
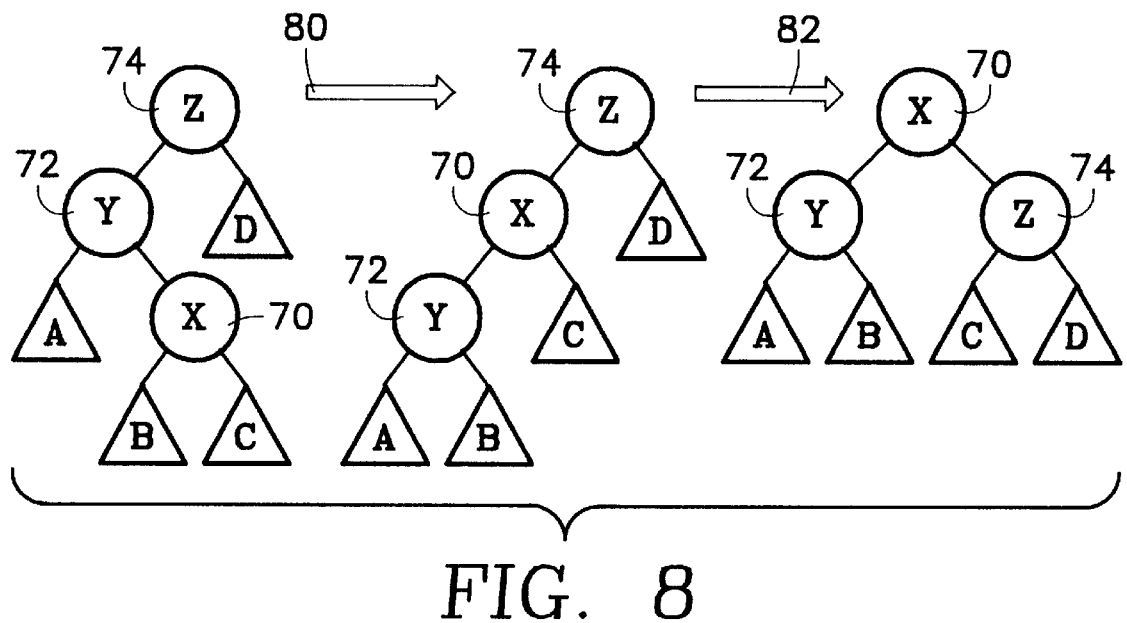
FIG. 8 illustrates Zig-Zag tree rotation of a splay tree.

The fourth case, sometimes called a Zig-Zag (or Zag-Zig) case, the node 70 and its parent 72 are either left-right or right-left descendants of the grandparent 74. In this case, the parent 72 is rotated 80 first, then the grandparent 74 is rotated 82, as shown in FIG. 8. These steps are repeated until the node has been promoted to the top of the tree and becomes the root.

Normally, the splay operation is performed whenever an event is inserted into or removed from the tree. However, by continually tracking the left-most node, events can be removed from the tree in constant time without applying the splay operation. While the heuristic of splaying may appear to have good amortized properties, it can involve an enormous amount of overhead since the number of rotations required can be very high. Table 7 shows the performance of Splay Trees. It should be noted that the splay operation reduces the number of operations for the Far Future and Two Hump distributions (which have a large amount of locality for event insertion). However, it performs poorly for the Flat and Near Future distributions (where events have very little locality during event insertion).

TABLE 7

Performance in milliseconds for Splay trees

| Dist.\ n | 10 | $10^2$ | $10^3$ | $10^4$ | $10^5$ |
|---|---|---|---|---|---|
| Flat | 0.00588 | 0.01111 | 0.01832 | 0.03351 | 0.05461 |
| Tri. Up | 0.00579 | 0.01018 | 0.01531 | 0.03079 | 0.05123 |
| Tri. Down | 0.00608 | 0.01157 | 0.01805 | 0.03449 | 0.05642 |
| Bell Shaped | 0.00422 | 0.00830 | 0.01389 | 0.02560 | 0.04555 |
| Asym. Near | 0.00616 | 0.01683 | 0.03283 | 0.05479 | 0.04327 |
| Asym. Far | 0.00376 | 0.00747 | 0.01180 | 0.02282 | 0.04002 |
| Near Future | 0.00617 | 0.01148 | 0.01948 | 0.03514 | 0.05694 |
| Far Future | 0.00357 | 0.00578 | 0.01041 | 0.01911 | 0.03365 |
| Two Hump | 0.00533 | 0.00841 | 0.01434 | 0.02548 | 0.04406 |

Figure 9:
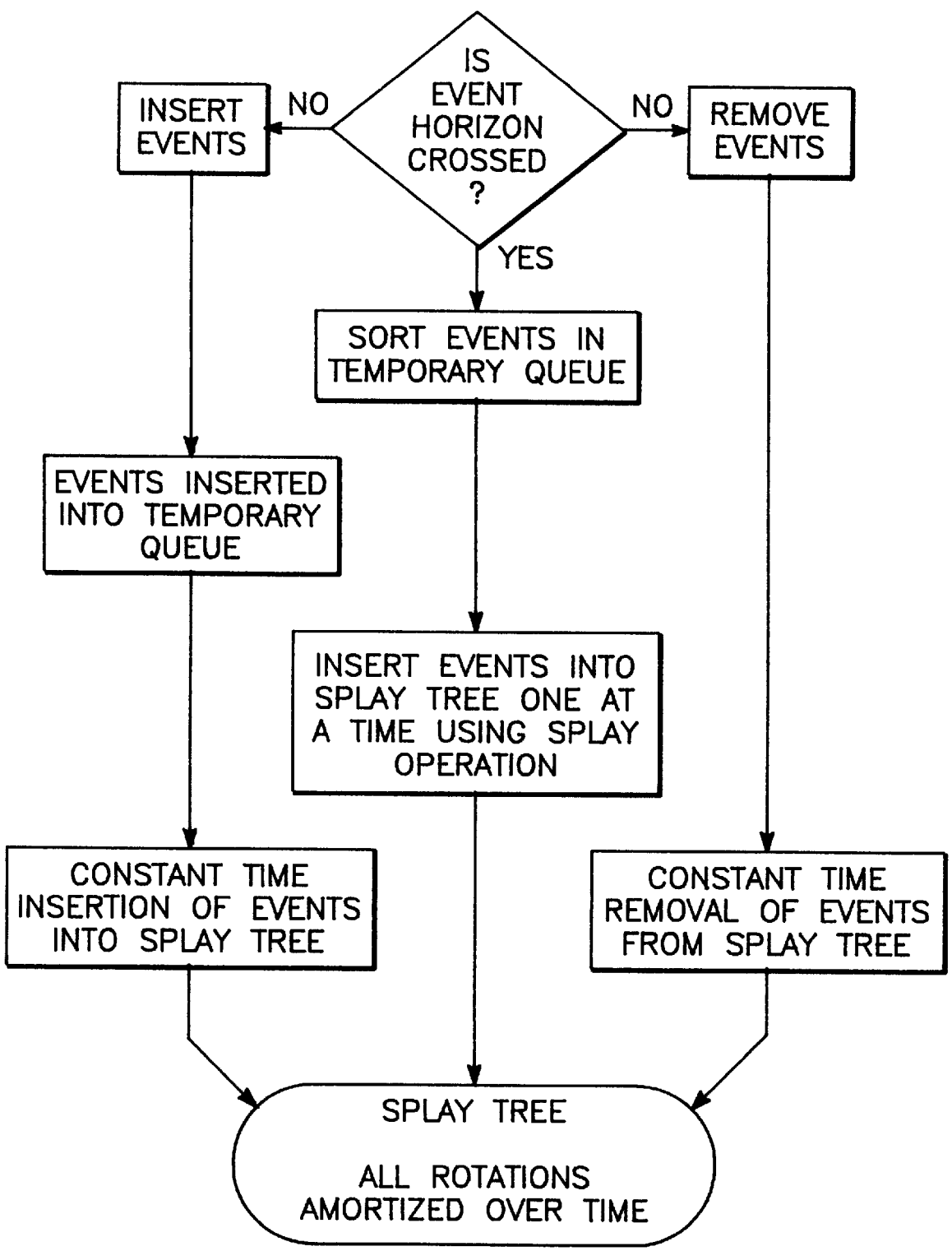
FIG. 9 illustrates a flow diagram of the SPEEDES Splay Tree data structure.

In accordance with the present invention, the event horizon is applied to splay trees as shown in FIG. 9. Namely, events are simply inserted into a temporary queue in order to provide constant insertion times. Removing events from the Splay tree can also be performed in constant time if the event horizon has not yet been crossed, and if the leftmost event is tracked in the Splay Tree without applying the splay operation. All of the real overhead in using the event horizon for Splay Trees comes when the event horizon is crossed.

When the event horizon is crossed, the events are sorted in the temporary list and then one at a time inserted into the Splay Tree using the splay operation. By sorting the events first, better locality is preserved as the events are inserted into the Splay Tree. One problem with this approach is that the splay tree can become grossly skewed to the left. This is because of the predominance of left rotations required as sorted events are inserted into the tree. However, this is normally not a problem since all of the rotations are amortized over time.

Because of the large overheads involved in Splay Trees, it should be noted this data structure is not preferred for event list management. Also, the SPEEDES Tree outperformed the Splay Tree in almost every case. Further, the SPEEDES Qheap is generally much faster and has no worst case scenarios. Performances results of a working example for the SPEEDES Splay Tree of the present invention are shown in Table 8. These results show that applying the event horizon to Splay Trees improves performance.

TABLE 8

Performance in milliseconds for the SPEEDES Splay tree.

| Dist.\ n | 10 | $10^2$ | $10^3$ | $10^4$ | $10^5$ |
|---|---|---|---|---|---|
| Flat | 0.00653 | 0.01083 | 0.01735 | 0.03024 | 0.04824 |
| Tri. Up | 0.00552 | 0.00942 | 0.01247 | 0.02459 | 0.04213 |
| Tri. Down | 0.00682 | 0.01203 | 0.01692 | 0.03143 | 0.05024 |
| Bell Shaped | 0.00468 | 0.00625 | 0.00856 | 0.02000 | 0.05803 |
| Asym. Near | 0.00580 | 0.01026 | 0.01360 | 0.02718 | 0.04517 |
| Asym. Far | 0.00440 | 0.00550 | 0.00696 | 0.01356 | 0.03959 |
| Near Future | 0.00718 | 0.01131 | 0.01875 | 0.0322 | 0.05106 |
| Far Future | 0.00404 | 0.00513 | 0.00633 | 0.01328 | 0.02822 |
| Two Hump | 0.00681 | 0.00924 | 0.01441 | 0.02437 | 0.04057 |

3. The Preferred Embodiment: The Qheap

Heaps are normally implemented as binary trees with the property that each node is at least as small as the value of its children nodes (if they exist). Although it is not necessary, heaps are almost always implemented using fixed arrays for storing pointers to their tree nodes. Modular arithmetic allows tree nodes to be directly accessed and manipulated, thereby allowing the normal tree traversal operations to be bypassed.

Instead of describing heaps using binary trees and exploiting modular arithmetic schemes with fixed arrays, the present invention is embodied in a novel implementation of a heap using only linked lists. The new data structure of the present invention is the preferred embodiment and is referred to as a Qheap. The benefits of the Qheap of the present invention are very low overheads (typical of linked list manipulations), freedom from fixed array data structures, and simplicity.

Fundamental to the Qheap is a sorted linked list, denoted by Q, that is never allowed to have more elements than a fixed size, denoted by S. The size, S, should roughly be chosen as the point where straight event insertion into an already sorted linked list outperforms traditional logarithmic techniques. If S is chosen to be 2, then the Qheap simply performs as a binary heap. However, just as divide and conquer sorting algorithms perform better when using straight insertion-sort techniques for small sublists, so does the Qheap by choosing S to be a reasonable value. Typical ranges for S might be somewhere between 20 and 80 (actual measurements indicated only about a 10% difference in performance for 20<S<80 a value of S=40 were used in the final results).

As elements are added to the Qheap, they are directly inserted into Q. However, if the number of elements in Q is equal to S, the list is first metasized into a single metaitem with its sort value determined by the first element of Q. Metasizing Q into a single metaitem is done prior to the insertion of the new element. As further elements are added to Q, the same procedure is repeated. It is therefore possible for Q to contain metaitems mixed with real event items. Further, when metasizing Q into a single metaitem, it is possible for the new metaitem to also contain metaitems which in turn might contain other metaitems, etc. In this manner, the Qheap is actually a recursively linked list data structure that closely relates to the heap property (although it is not necessarily a binary heap).

Figure 10A:
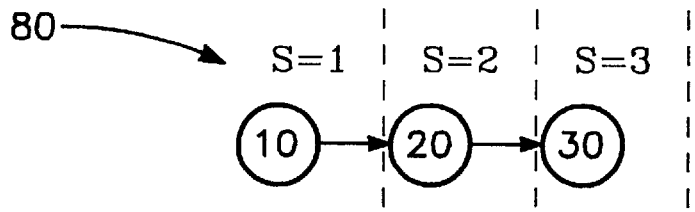
FIGS. 10A–10D illustrate examples of inserting elements into the Qheap.
Figure 10B:
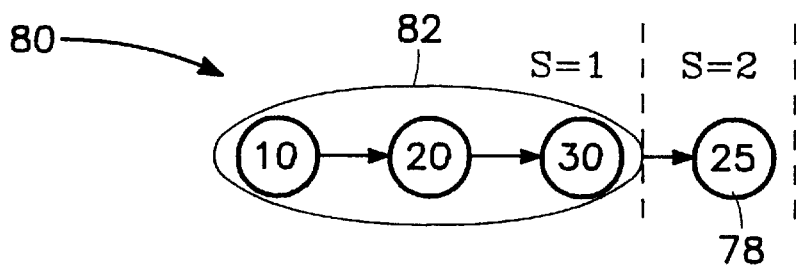

FIGS. 10A–10D illustrate examples of inserting elements into the Qheap of the present invention. As shown in FIG. 10B a new item 78 with a value of 25 needs to be inserted into a Qheap 80 of FIG. 10A with an S value equal to 3. It is assumed that the Qheap already contains 3 items, each with a value. In the first step, the item 78 with value 25 is inserted. Because there are already 3 items in Qheap 80, the items in Qheap 80 are metasized into a single metaitem 82 with value 10 and then the item with value 25 is inserted. Referring to FIG. 10B, Qheap 80 now contains two items, namely item 78 and metaitem 82.

Figure 10C:
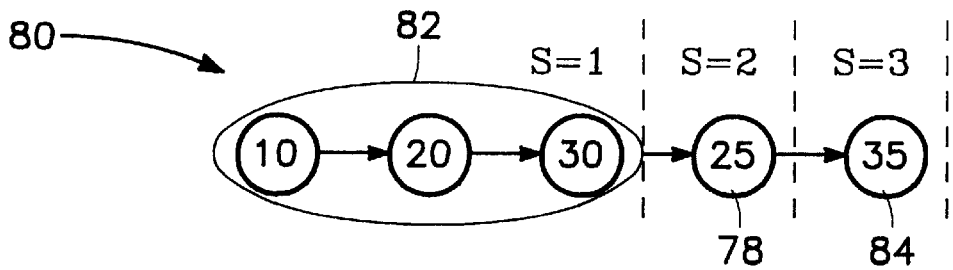

In a second step, referring to FIG. 10C, an item 84 with value 35 is inserted directly into Qheap 80 because the Qheap 80 is less than the maximum value of S=3.

Figure 10D:
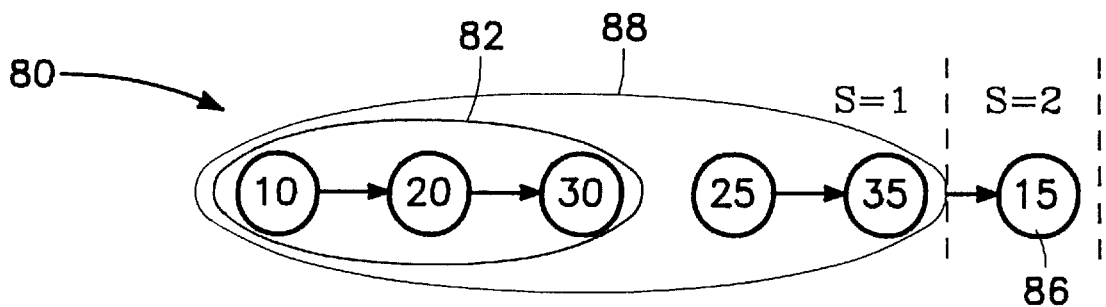

In a third step, referring to FIG. 10D, an item 86 with a value 15 needs to be inserted into the Qheap 80. However, since there are already S=3 items in Qheap 80 (maximum value), the items 82, 78, 84 of FIG. 10C are metasized into a single item 88 and then the item 86 with value 15 is inserted into the Qheap 80. Referring to FIG. 10D, the Qheap 80 ends up with 2 items 88, 86, one of which is a complex metaitem 88.

Removing items from the Qheap is more difficult than inserting items because it is possible that the item removed from the top of the Qheap is actually a metaitem itself. If this is so, then the metaitem must be untangled by removing its top item, redefining the rest of the metaitem's list as a new metaitem, making sure that the Qheap does not have more than S elements (if it does, then the elements in the Qheap are turned into a single metaitem and placed back into the Qheap as its only element), and then inserting this new metaitem back into the Qheap. The untangling procedure is repeated until a single element is found.

Figure 11A:
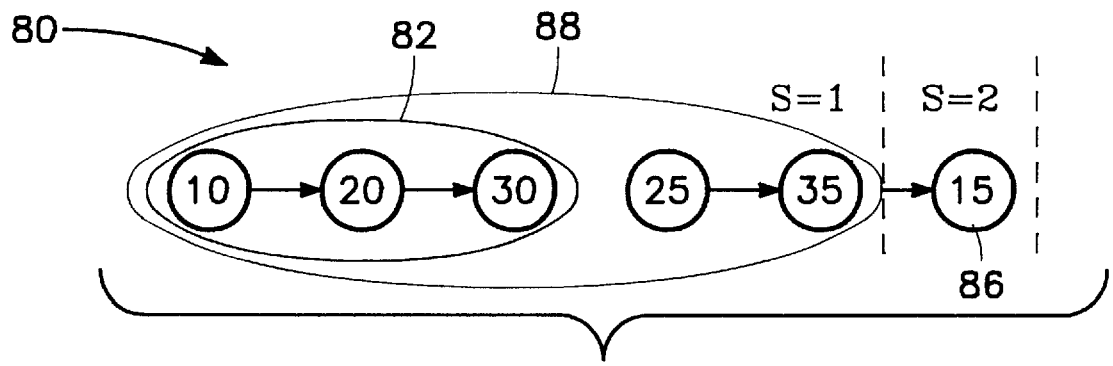
FIGS. 11A–11C illustrate a specific example of removing an item from the Qheap.
Figure 11B:
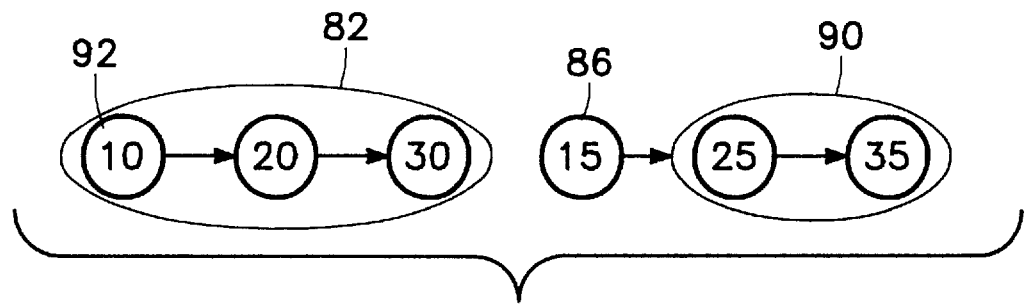
Figure 11C:
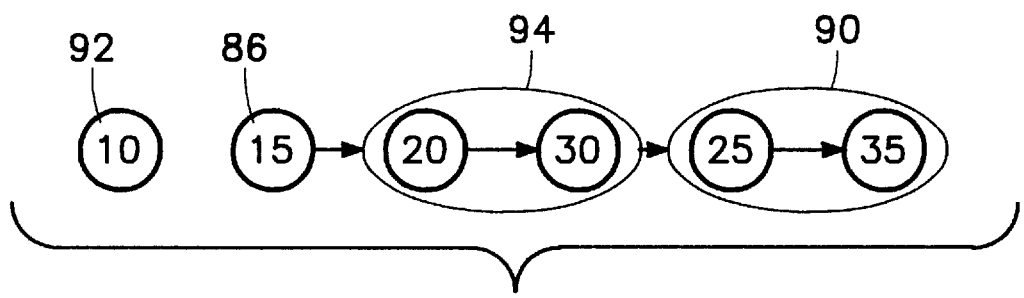

FIGS. 11A–11C illustrate a specific example of removing an item from the Qheap 80 of the present invention. It is again assumed that the Qheap has S=3 and that the Qheap 80 initially has two items, item 88, which is comprised of a top metaitem 82 and another two items, and item 86.

In a first step, the metaitem 88 with value 10 is removed from the Qheap 80. Since item 88 is a metaitem, the top metaitem 82 (containing 10,20,30) is removed. The rest (containing 25,35) are redefined as a new metaitem 90. This new metaitem 90 with value 25 is inserted back into the Qheap 80.

Referring to FIG. 11B, in a second step, the item 92 with value 10 is removed from the metaitem 82 (containing 10,20,30). The rest of the items (20,30) are redefined as a new metaitem 94 and inserted back into Qheap 80 with value 20, as shown in FIG. 11C. Since the remaining item 92 (value 10) is a single item (not a metaitem), the untangling procedure is finished. The item 92 (value 10) is then returned from the remove operation. Performance results of a working example for the Qheap are provided in Table 9. These results were obtained using the value of 40 for S.

TABLE 9

Performance in milliseconds for the Qheap of the present invention.

| Dist.\ n | 10 | $10^2$ | $10^3$ | $10^4$ | $10^5$ |
| --- | --- | --- | --- | --- | --- |
| Flat | 0.00328 | 0.00636 | 0.01131 | 0.01829 | 0.02913 |
| Tri. Up | 0.00302 | 0.00652 | 0.01084 | 0.01746 | 0.02848 |
| Tri. Down | 0.00311 | 0.00689 | 0.01196 | 0.01801 | 0.02928 |
| Bell Shaped | 0.00320 | 0.00662 | 0.01007 | 0.01644 | 0.02655 |
| Asym. Near | 0.00329 | 0.00672 | 0.01123 | 0.01847 | 0.02967 |
| Asym. Far | 0.00283 | 0.00634 | 0.00811 | 0.01496 | 0.02371 |
| Near Future | 0.00324 | 0.00671 | 0.01136 | 0.01793 | 0.02943 |
| Far Future | 0.00289 | 0.00606 | 0.00701 | 0.01323 | 0.02134 |
| Two Hump | 0.00286 | 0.00497 | 0.00836 | 0.01470 | 0.02314 |

4. SPEEDES Qheap

Figure 12:
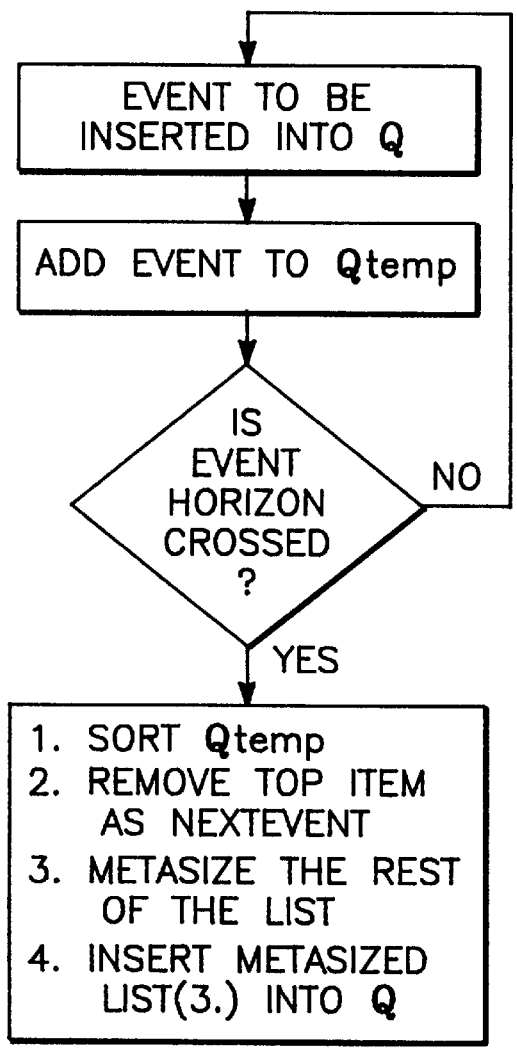
FIG. 12 is a flow chart illustrating an overview of the Qheap operation.

Further, the event horizon can be applied to the Qheap to form a SPEEDES Qheap in accordance with the present invention. FIG. 12 is a flow chart illustrating an overview of the Qheap operation with the event horizon. Namely, instead of directly inserting events into Q, they are added to $Q_{temp}$. When the event horizon is crossed, $Q_{temp}$ is sorted, the top item is removed as the next event, the rest of the list is metasized, and then inserted into Q. The obvious advantage of using $Q_{temp}$ is to provide for larger numbers of events to be in a single metaitem, thereby reducing the average number of untangling steps. This new data structure is an alternative embodiment of the Qheap (the preferred embodiment) of the present invention and will be referred to as the SPEEDES Qheap, and can be used in the SPEEDES operating system.

Because heaps are known to have worst case $\log_2(n)$ amortized behavior, the SPEEDES Qheap data structure should never break down. Also, because it is composed from linked lists, it will have very low overheads. In addition, complicated rotation operations or balancing heuristics are not necessary. Moreover, the SPEEDES Qheap data structure does not require fixed sized arrays or modular arithmetic. It should be noted that, however, an untangling procedure, although very straight-forward, may be required. Performance results of a working example for the SPEEDES Qheap are provided in Table 10.

TABLE 10

Performance in milliseconds for the SPEEDES Qheap of the present invention.

| Dist.\ n | 10 | $10^2$ | $10^3$ | $10^4$ | $10^5$ |
| --- | --- | --- | --- | --- | --- |
| Flat | 0.00275 | 0.00472 | 0.00778 | 0.01156 | 0.01627 |
| Tri. Up | 0.00319 | 0.00484 | 0.00627 | 0.00996 | 0.01588 |
| Tri. Down | 0.00273 | 0.00512 | 0.00791 | 0.01208 | 0.01664 |
| Bell Shaped | 0.00274 | 0.00447 | 0.00563 | 0.01074 | 0.01918 |
| Asym. Near | 0.00283 | 0.00464 | 0.00647 | 0.01014 | 0.01691 |
| Asym. Far | 0.00301 | 0.00466 | 0.00552 | 0.00967 | 0.01818 |
| Near Future | 0.00279 | 0.00482 | 0.00853 | 0.01255 | 0.01697 |
| Far Future | 0.00244 | 0.00440 | 0.00510 | 0.01024 | 0.01713 |
| Two Hump | 0.00282 | 0.00412 | 0.00619 | 0.01035 | 0.01425 |

Because of the very favorable properties, the SPEEDES Qheap data structure is highly recommended for general event list management in discrete-event simulations. Provided below is a step-by-step procedure for supporting the SPEEDES Qheap.

SPEEDES Qheap Insertion

Figure 13:
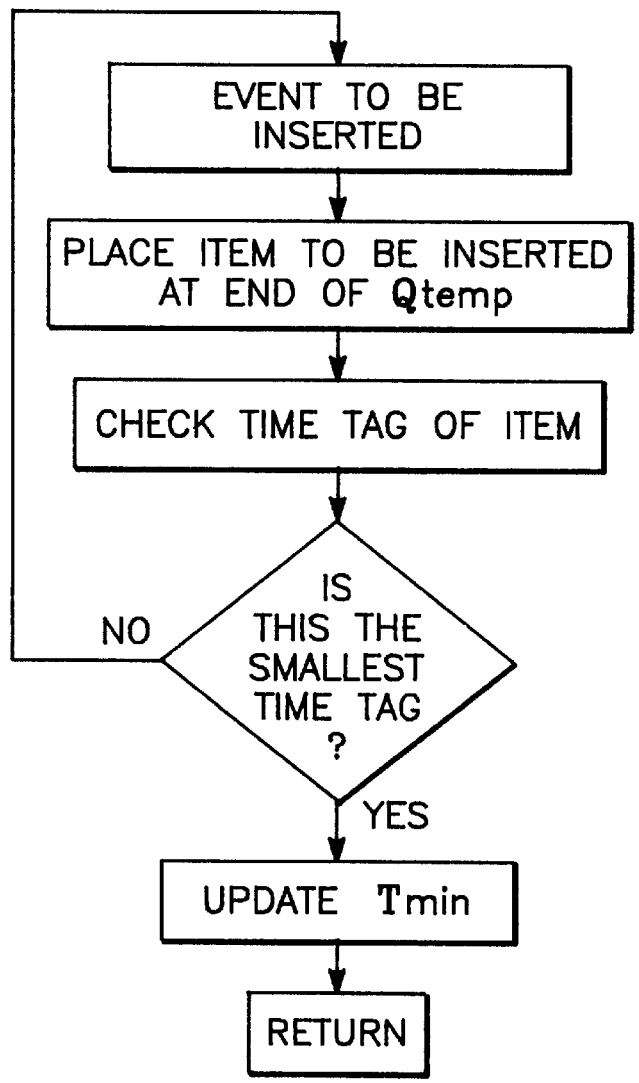
FIG. 13 is a flow chart illustrating Qheap insertion.

FIG. 13 is a flow chart illustrating Qheap insertion.
I. Place the item to be inserted at the end of the $Q_{temp}$.
II. Update $T_{min}$ if this item has the smallest time tag out of all the items in $Q_{temp}$.

SPEEDES Qheap Removal

Figure 14A:
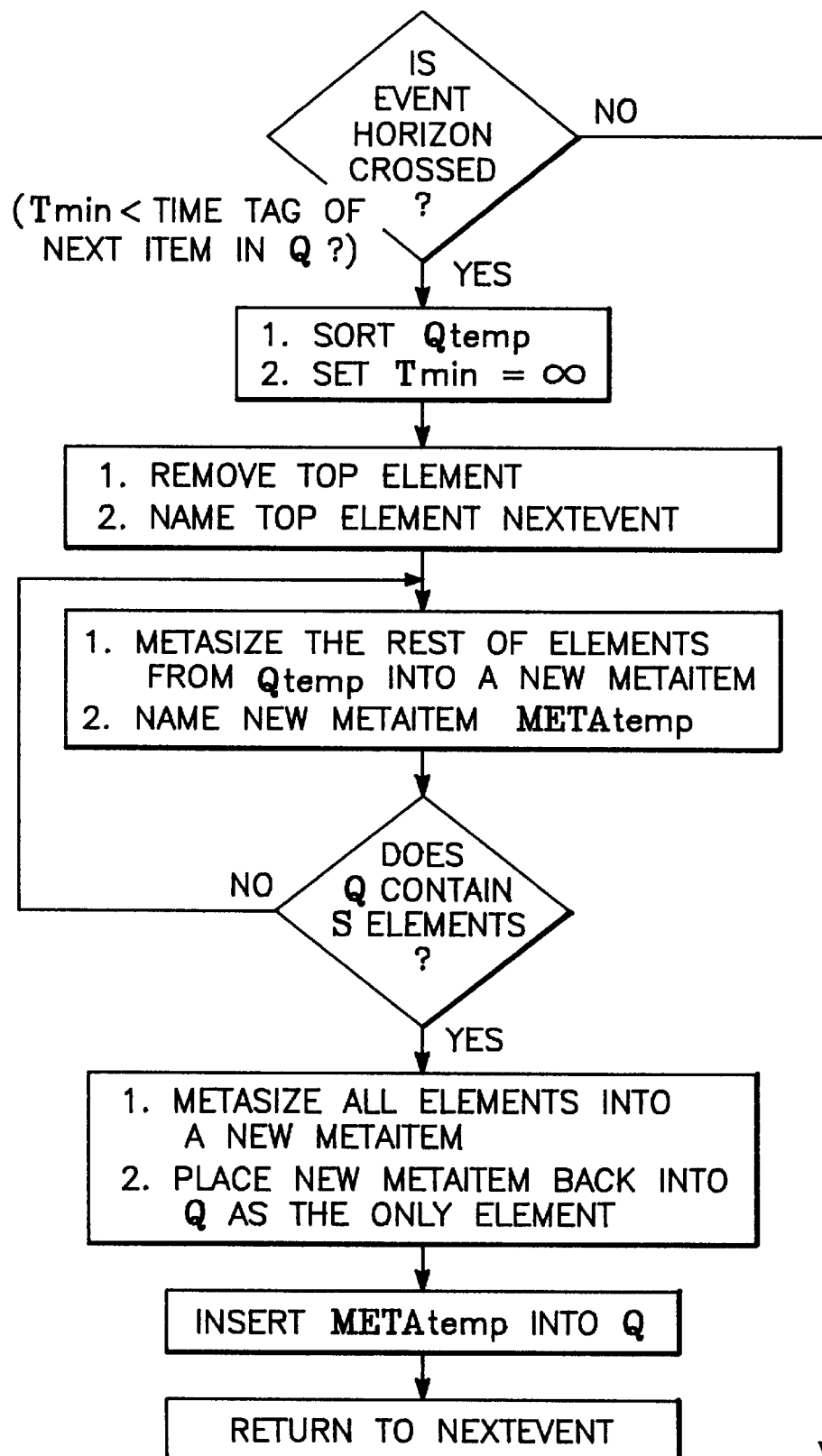
FIG. 14 is a flow chart illustrating Qheap removal.
Figure 14B:
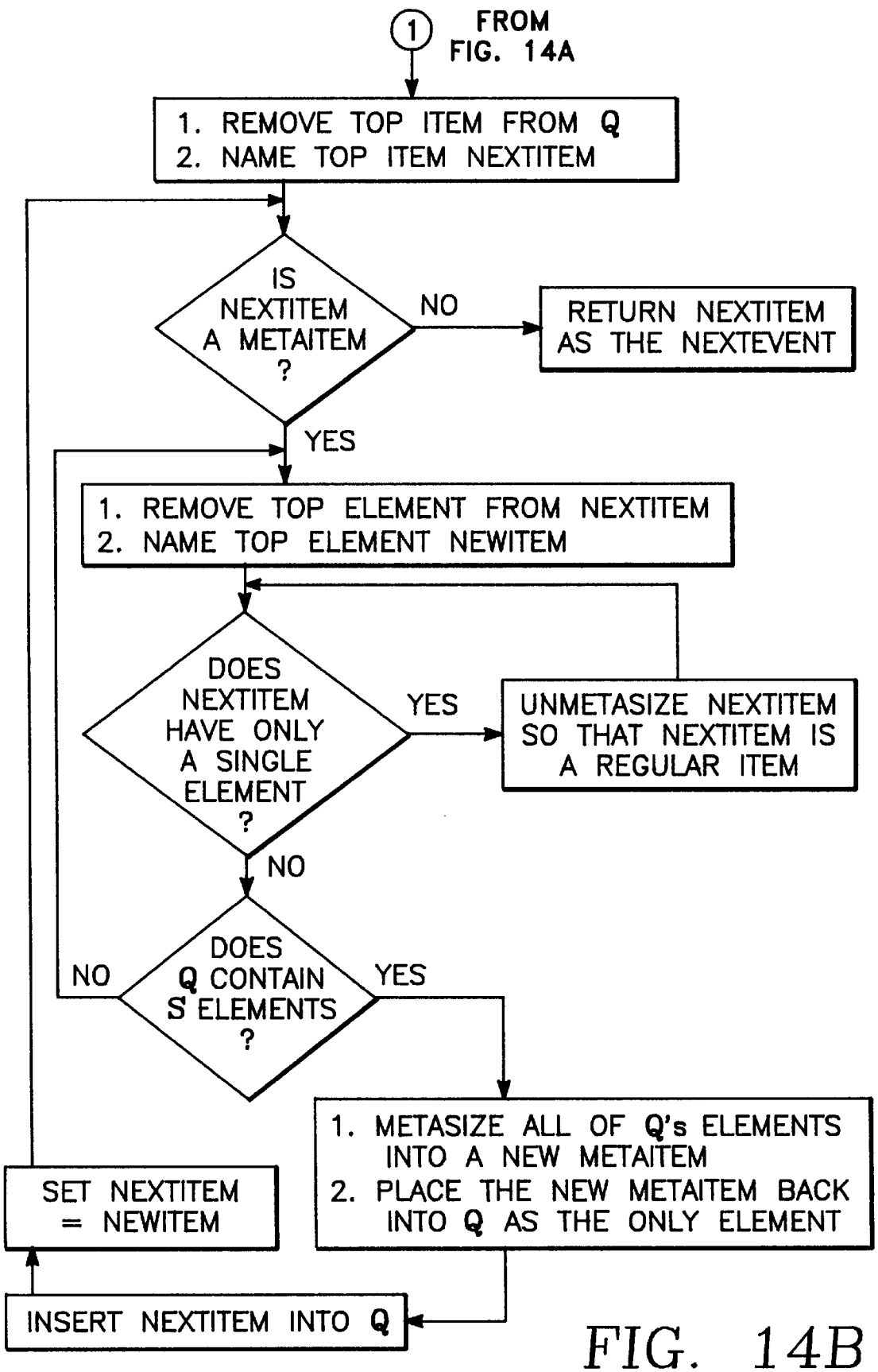

FIG. 14 is a flow chart illustrating Qheap removal.
I. Check if the event horizon is crossed (i.e., if $T_{min}$ is less than the time tag of the next item in Q). If so, perform steps a through f and then return. Otherwise, go on to step 2.
  a. Sort $Q_{temp}$ and then set $T_{min}$ to infinity.
  b. Remove the top element (this is what is returned as the next event) and call it NextEvent.
  c. Metasize the rest of the elements from $Q_{temp}$ into a new metaitem called Metatemp.
  d. Check if Q already contains S elements. If it does, metasize all of its elements into a new metaitem and place it back into Q as its only element.
  e. Insert Metatemp into Q.
  f. Return NextEvent.
II. Remove the top item from Q and call it NextItem. Then loop over steps a through e below until NextItem is not a metaitem.
  a. Check if NextItem is a metaitem. If not, then break out of the loop and return NextItem as the NextEvent. Otherwise, it is known that NextItem is a metaitem which must be untangled in the steps b-e below.
  b. Remove the top element from NextItem and call it NewItem. NextItem now contains one less item. If NextItem has only a single element, then unmetasize it so that NextItem is a regular item.
  C. Check if Q already contains S elements. If it does, metasize all of its elements into a new metaitem and place it back into Q as its only element.
  d. Insert NextItem into Q.
  e. Set the item NextItem=NewItem and then go back to step a.

Conclusions

The present invention is embodied in various priority queue data structures with enhanced performance to exploit the event horizon. Results from working examples indicate that the SPEEDES Qheap easily outperformed the other data structures without any "worst-case" problems. The SPEEDES Qheap is not a binary heap, but instead is recursively constructed from linked lists. Thus, it has low overheads that are typical of linked lists.

The SPEEDES Qheap can also be applied to Calendar Queues. For instance, the SPEEDES Qheap can be used instead of linked lists for each time bucket. The benefits of this may provide significant improvements in worst-case Calendar Queue performance.

This concludes the description of the preferred embodiment and alternative embodiments of the invention. The foregoing description of the invention's preferred and alternative embodiments has been presented for the purposes of illustration and description. It is not intended to be exhaustive or to limit the invention to the precise form disclosed. Many modifications and variations are possible in the light of the above teaching. It is intended that the scope of the invention be limited not by this description, but rather by the claims appended hereto.

What is claimed is:

1. A computer-implemented process for managing events within a priority queue stored on a computer, comprising the steps of:
   a) limiting the priority queue to having only S elements;
   b) directly inserting an element into the priority queue at a predetermined first event occurrence and at a certain value of S;
   c) directly removing an element from the priority queue at a predetermined second event occurrence and at a certain value of S; and
   d) metasizing the priority queue into a single metaitem after a trigger value of S is realized and an element needs to be inserted, and assigning a sort value determined by a first element located in the priority queue, wherein metasizing the priority queue into a single metaitem is performed prior to insertion of a new element, and wherein said process provides fast and predicable event list management for computer simulation systems.

2. The process for managing events as set forth in claim 1, wherein the predetermined first event occurrence is when the element needs to be added to the priority queue.

3. The process for managing events as set forth in claim 1, wherein the predetermined second event occurrence is when the element needs to be removed from the priority queue.

4. The process for managing events as set forth in claim 1, wherein a certain value of S is defined by a number of elements in the queue less than S.

5. The process for managing events as set forth in claim 4, wherein the trigger value of S is realized when the number of elements in the priority queue is equal to S.

6. The process for managing events as set forth in claim 1, wherein steps a–d are recursively repeated for all new elements added or removed.

7. The process for managing events as set forth in claim 6, wherein the step of metasizing the priority queue into a single metaitem produces a priority queue with metaitems comprised of metasized items.

8. An event manager for managing events, comprising:
   a programmable computer having memory;
   a priority queue interactive with said events, said priority queue and said events stored on said computer in said memory; and
   at least one element located within said priority queue;
   wherein said priority queue being limited to having only S elements, wherein said elements are comprised of real event items and metasized metaitems only when a trigger value of S is realized and at a predetermined event occurrence, and wherein said computer being directed by said priority queue to manage said events.

9. The event manager as set forth in claim 8, wherein the predetermined event occurrence is when the element needs to be added to the priority queue.

10. The event manager as set forth in claim 8, wherein the trigger value of S is realized when the number of elements in the priority queue is equal to S.

11. An event manager for managing events for computer simulation systems, comprising:
   a) a programmable computer having memory;
   b) a priority queue interactive with said events and limited to having only S elements, said priority queue and said events stored on said computer in said memory;
   c) means for directly inserting an element into the priority queue only at a certain value of S and at a predetermined first event occurrence;
   d) means for directly removing an element from the priority queue only at a certain value of S and at a predetermined first event occurrence; and
   e) means for metasizing the priority queue into a single metaitem when a trigger value of S is realized and at a predetermined first event occurrence, means for assigning a sort value determined by a first element located in the priority queue, wherein the priority queue is metasized prior to insertion of a new element.

12. The event manager as set forth in claim 11, wherein the predetermined first event occurrence is when the element needs to be added to the priority queue.

13. The event manager as set forth in claim 11, wherein the predetermined second event occurrence is when the element needs to be removed from the priority queue.

14. The event manager as set forth in claim 11, wherein the trigger value of S is realized when the number of elements in the priority queue is equal to S.

15. The event manager as set forth in claim 14, wherein the priority queue contains at least one of a metaitem and a real event item.

16. A computer-implemented process for managing events within a priority queue stored on a computer, said priority queue interactive with an event horizon defined by events processed in successive cycles, said computer-implemented process comprising the steps of:
   a) directly inserting an element into a temporary queue at a predetermined first event occurrence and when the event horizon has not been crossed so that a next event to be processed is not in the temporary queue, wherein said temporary queue is comprised of a top item and successive items;
   b) directly removing an element from the temporary queue at a predetermined second event occurrence and when the event horizon has not been crossed; and
   c) sorting the temporary queue when the event horizon is crossed, by removing the top item and naming it a next event, metasizing the successive items in the list, and then inserting an element into the queue that needs to be inserted, wherein said process provides fast and predicable event list management for computer simulation systems.

17. The process for managing events as set forth in claim 16, wherein the predetermined first event occurrence is when the element needs to be added to the priority queue.

18. The process for managing events as set forth in claim 17, wherein the predetermined second event occurrence is when the element needs to be removed from the priority queue.

19. The process for managing events as set forth in claim 16, wherein the event horizon has infinite cycles.

20. A computer-implemented process for managing events within a priority queue stored on a computer, said priority queue interactive with an event horizon defined by events processed in successive cycles, said computer-implemented process comprising the steps of:
  a) continually maintaining a primary list and a secondary list for said priority queue which is comprised of a tree with a starting root forming paths diverging from the root;
  b) sorting only the primary list at a first predetermined time;
  c) traversing along one of the paths as an event is removed until the event is removed and traversing along one of the paths as an event is inserted until the event is inserted;
  d) recursively placing a new event into the secondary list and applying a balancing heuristic at each node along the traversed path when a new event is scheduled to be inserted;
  e) preserving an earliest event scheduled to occur in the secondary list; and
  f) sorting the secondary list at a second predetermined time and then merging the secondary list into the primary list, wherein said process provides fast and predicable event list management for computer simulation systems.

21. The process for managing events as set forth in claim 20, wherein the first predetermined time is when events do not need to be processed.

22. The process for managing events as set forth in claim 20, wherein the second predetermined time is when events need to be processed.

23. The process of managing events as set forth in claim 20, wherein said priority queue is a balanced binary tree.

24. The process of managing events as set forth in claim 20, wherein steps (c) and (d) comprise the steps of inserting an event into a temporary queue for providing constant insertion times, removing events in constant time if the event horizon has not been crossed, sorting the events in the temporary queue when the event horizon is crossed, and inserting the event into the tree one at a time.

25. The process of managing events as set forth in claim 24, wherein said priority queue is a splay tree.

26. A computer-readable medium for causing a computer system to manage events for computer simulation systems, comprising:
  a computer-readable storage medium;
  a computer program stored on said medium;
  wherein said computer program operates on said computer system and performs event management, wherein said computer program comprises,
    a priority queue interactive with said events, and
    at least one element located within said priority queue, wherein said priority queue being limited to having only S elements, wherein said elements are comprised of real event items and metasized metaitems at a predetermined event occurrence and after a trigger value of S is realized.

27. The event manager as set forth in claim 26, wherein the predetermined event occurrence is when the element needs to be added to the priority queue.

28. The event manager as set forth in claim 27, wherein the trigger value of S is defined by a number of elements in the queue equal to S.

29. The event manager as set forth in claim 28, wherein the priority queue contains at least one of a metaitem and a real event item.

* * * * *